United States Patent [19]

Ehrlich

[11] Patent Number: 5,227,671
[45] Date of Patent: Jul. 13, 1993

[54] CIRCUIT PROVIDING EQUALIZED DUTY CYCLE OUTPUT

[75] Inventor: Michael S. Ehrlich, Santa Clara, Calif.

[73] Assignee: Quantum Corporation, Milpitas, Calif.

[21] Appl. No.: 868,984

[22] Filed: Apr. 14, 1992

[51] Int. Cl.⁵ .................. H03K 5/00; H03K 3/01; H03K 5/08; G06G 7/12
[52] U.S. Cl. .................. 307/261; 307/270; 307/351; 307/494; 328/36; 328/127
[58] Field of Search ........... 307/261, 263, 494, 354, 307/571, 573, 270, 350, 351; 328/36, 127

[56] References Cited

U.S. PATENT DOCUMENTS

| | | | |
|---|---|---|---|
| 4,360,747 | 11/1982 | Ryan | 307/354 |
| 4,480,200 | 10/1984 | Tan et al. | 307/354 |
| 4,634,892 | 1/1987 | Isbell et al. | 307/494 |

Primary Examiner—William L. Sikes
Assistant Examiner—Trong Quang Phan
Attorney, Agent, or Firm—David B. Harrison

[57] ABSTRACT

A duty cycle equalization circuit equalizes the duty cycle of an incoming two-level logic driving signal and includes a CMOS current source having source electrodes connected to receive the two-level logic driving signal and having drain electrodes connected to a sawtooth signal forming path, a sawtooth wave forming circuit element, such as a capacitor, connected to the sawtooth signal forming path for forming a sawtooth waveform, a reference voltage circuit, such as a low pass filter, for generating a reference voltage level as a function of the two-level logic driving signal, and a differential comparator circuit element connected to receive the sawtooth waveform at a data input thereof, and to receive the reference voltage at a reference signal input thereof, and to put out a logical signal timed to correspond with crossings of the sawtooth signal through the reference voltage level.

11 Claims, 2 Drawing Sheets

CIRCUIT PROVIDING EQUALIZED DUTY CYCLE OUTPUT

FIELD OF THE INVENTION

The present invention relates to electronic circuits. More particularly, the present invention relates to an electronic circuit providing same-frequency equalized duty cycle output without requiring frequency multiplication or division signal processing.

BACKGROUND OF THE INVENTION

It is desirable for many digital signal processing applications to shape a two-phase clock signal having an incoming non-symmetrical waveform in order to provide a symmetrical or "square wave" output, in which each half of the duty cycle equals the other half. One known way to provide such an output is to apply a phase locked loop to double the incoming clock frequency and then divide the output of the phase locked loop with a divider, such as a D flip-flop. The drawbacks of this approach are that it is complex and therefore expensive in terms of costs of implementation and "real estate" of integrated circuit arrays.

It is also known to form a digital circuit using an exclusive-OR gate having one input connected to an incoming signal stream, and having another input connected through a delay element to the same incoming stream. If the input to such a circuit is a 50% duty cycle clock, the output is a clock at twice the frequency, with a duty cycle ranging between 20% and 80%. If, for example, it is assumed that the delay element provides a delay which is nominally 40% of the period of the outgoing clock, process variations in forming an integrated circuit containing the delay will result in a delay which is as small as one half, or as large as two times, the nominal 40% delay. Because a worst case or 20% duty cycle clock is unacceptable for most applications (and effectively prohibits further multiplication), a hitherto unsolved need has arisen for a simplified and improved method and circuit for altering the duty cycle of the exclusive-OR gate to provide an equalized duty cycle output.

SUMMARY OF THE INVENTION WITH OBJECTS

A general object of the present invention is to provide a method and circuit for altering the duty cycle of an incoming digital logic signal in order to provide an equalized duty cycle output in a manner which overcomes limitations and drawbacks of the prior art.

A more specific object of the present invention is to provide a simplified frequency doubler for doubling the frequency of an equal duty cycle clock.

Another specific object of the present invention is to provide a simplified, cost reduced waveshaping circuit for shaping an incoming signal not having an equal duty cycle into a signal having an equal duty cycle.

A further specific object of the present invention is to provide a CMOS clock duty cycle equalization circuit which lends itself to ready adaption to existing CMOS large scale integrated circuit fabrication processes and structures, and which may readily be incorporated within integrated circuit designs.

In accordance with principles of the present invention, a duty cycle equalization circuit is provided for equalizing the duty cycle of an incoming two-level logic driving signal. The equalization circuit includes a CMOS current source having source electrodes connected to receive the two-level logic driving signal and having drain electrodes connected to a sawtooth signal forming path, a sawtooth wave forming circuit element, such as a capacitor, connected to the sawtooth signal forming path for forming a sawtooth waveform, a reference voltage circuit for generating a reference voltage level as a function of the two-level logic driving signal, and a differential comparator circuit element connected to receive the sawtooth waveform at a data input thereof, and to receive the reference voltage at a reference signal input thereof, and to put out a logical signal timed to correspond with crossings of the sawtooth signal through the reference voltage level.

In one aspect of the present invention, a driver circuit is connected to a clock source providing a clocking signal, for generating the two-level logic driving signal. In a related aspect, the clock source includes an undelayed incoming clock path, a delay connected to delay the clocking signal by a predetermined amount, and an exclusive-OR gate connected to compare the undelayed incoming clocking signal and the delayed clocking signal to provide a new clocking signal at twice the frequency of the undelayed incoming clocking signal.

In another aspect of the present invention, the reference voltage circuit comprises a low pass filter having an input connected to the sawtooth signal forming path and having an output connected to commonly connected gate electrodes of the CMOS current source, and wherein the function of the two-level driging signal is an approximately linear average of the sawtooth waveform.

In another aspect of the present invention, the sawtooth wave forming circuit element comprises a second CMOS current source having a common source electrode connection connected to receive the two-level logic driving signal and having a common drain electrode output path to which a signal storage element, such as a second capacitor is connected, the output path for providing the reference voltage level to the differential comparator.

In one more aspect of the present invention, noise reduction resistors are provided in series with the source electrodes of the CMOS current source.

In yet another aspect of the present invention, a buffer-driver supplied from a noiseless power supply is connected between the driver and an input of the duty cycle equalization circuit.

These and other objects, advantages, aspects and features of the present invention will be more fully understood and appreciated upon consideration of the following detailed description of a preferred embodiment, presented in conjunction with the accompanying drawings.

DETAILED DESCRIPTION OF A PREFERRED EMBODIMENT

Figure 1:
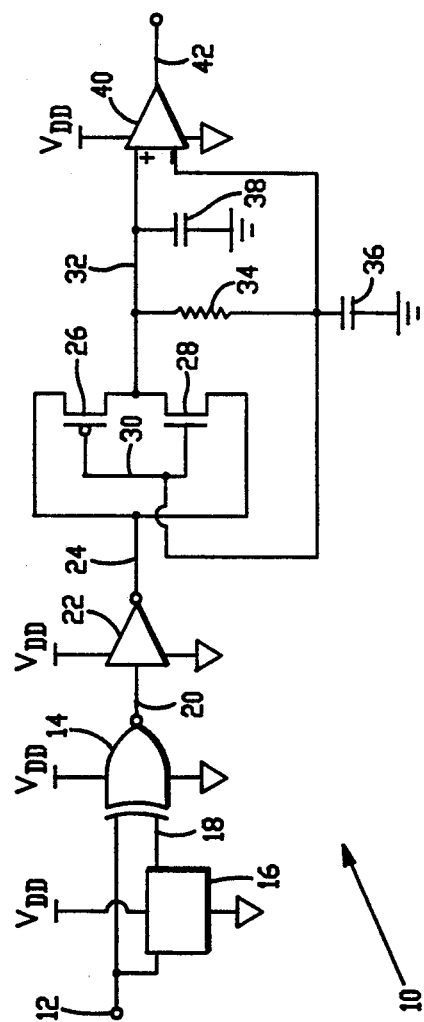
FIG. 1 is a simplified schematic circuit diagram of a circuit in accordance with principles and aspects of the present invention.

With reference to FIG. 1 a circuit 10 is most preferably formed as a circuit cell of a very large scale CMOS integrated circuit array including a voltage supply rail $V_{DD}$ and a ground rail GROUND. The circuit 10 includes an input 12 which receives a clock input signal at a predetermined first frequency F, such as 40 MHz, for example. The incoming signal waveform is graphed in graph A of FIG. 2. The incoming signal on the path 12 e.g. passes directly to one input of an exclusive-OR gate 14, and also passes into a delay circuit 16. The delay circuit 16 delays the signal on the path 12 by a predetermined delay period. With a 40 MHz exemplary clocking frequency, a delay of 5 nanoseconds is nominal; however, delays of as little as 2.5 nanoseconds and as great as 10 nanoseconds may be experienced in practice. The delayed incoming clocking signal is put out over a path 18 to another input of the exclusive-OR gate 14.

The exclusive-OR gate 14 compares the delayed and undelayed incoming signals, and puts out a first logical signal while the two incoming signals are at different values, and a second logical signal while they have the same value. The delay makes the values different for the duration of the delay period upon encountering every transition edge of the incoming signal. The resultant action of the exclusive-OR gate 14 is effectively to double the incoming clocking frequency and is graphed in graph B of FIG. 2.

The frequency-doubled signal which does not have an equal duty cycle is then passed through a buffer-driver 22 to a path 24 which includes two complementary metal oxide silicon (CMOS) insulated gate field effect transistors in parallel connection therewith. One of the transistors 26 is a P-channel type, while the other transistor 28 is an N-channel type as is conventional for a CMOS cell, for example. The gates of the respective transistors 26 and 28 are connected together at a path 30. A common drain electrode, output node 32 includes a resistor 34 connected to the path 30. A capacitor 36 connects the path 30 to ground. Together, the resistor 34 and the capacitor 36 form an averaging circuit, often referred to as a low pass filter network. A sawtooth-wave-forming capacitor 38 is also connected between the path 32 and ground.

The path 32 leads directly to a positive input (+) of a differential comparator 40. The path 30 leads directly to a negative or reference level input (−) of the comparator 40. The signals on the paths 32 and 30 are respectively graphed in graph C of FIG. 2. In graph C, the V+ input on the path 32 represents a sawtooth waveform which results from the successive forced forward and reverse charging of the sawtooth capacitor 38 as the transistors 26 and 28 successively conduct in response to the incoming driving signal, graph B of FIG. 2.

Figure 2:
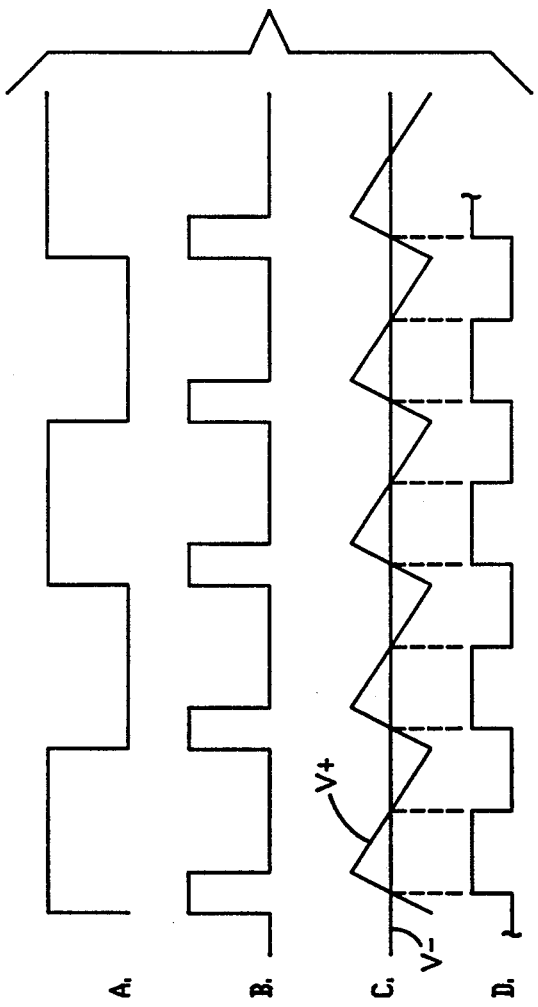
FIG. 2 is a set of waveform graphs arranged along a common horizontal time base and illustrating operation of the FIG. 1 circuit: graph A being of an incoming digital signal at a frequency F; graph B being of a multiplied, asymmetrical signal put out by an exclusive-or gate of the FIG. 1 circuit; graph C being of a sawtooth driving signal appearing across two complementary field effect transistors of the FIG. 1 circuit; and, graph D being of the equal duty cycle symmetrical output of the FIG. 1 circuit at a 2F frequency.

As shown in graph C of FIG. 2, the sawtooth waveform at the positive input of the comparator 40 passes through a reference level V− which is established by the averaging circuit 34, 36 and held in the capacitor 36 and is present on the path 30. The crossings of the sawtooth through the reference level are detected and put out by the comparator 40 on an output path 42 as graphed, for example, in graph D of FIG. 2. Graph D shows that the output signal high time on the path 42 is the sum of one half of the rising tooth edge time and one half of the falling tooth edge time of the sawtooth waveform of graph C. Symmetry of duty cycle is thereby obtained irrespective of the characteristics of the unequal duty cycle as graphed in graph B of FIG. 2, in providing e.g. an 80 MHz square wave output on the path 42 without requiring a phase locked loop or other more complicated circuitry.

When the FIG. 1 circuit 10 is designed to operate at e.g. 80 MHz, the reference capacitor 36 has a suitable time constant such that 80 MHz is much larger than $1/RC_{36}$. A nominal value of about 5.0 picofarads is satisfactory, while the sawtooth capacitor 38 has a nominal value of about 0.1 picofarads. The CMOS transistor drive current $I_{DS}$ is approximately 50 microamperes at a $V_{GS}$ of 5 volts. The low pass filter resistor 34 has a nominal value of approximately 200K ohms. Also, the channel lengths of the transistor current sources 26 and 28 should be long enough so that the effect of the known lambda characteristic is negligible, i.e. the transistors 26 and 28 are designed to be true current sources. The resistance of the resistor 34 in the low pass filter is selected to be large enough so that the current through it is negligible, compared to the current passing through the transistor sources 26 and 28.

Desired operation of the circuit 10 is premised upon operation of the transistors 26 and 28 in a saturation mode. As noted above, the two transistors 26 and 28 act as current sources, charging the sawtooth capacitor 38 in forward and reverse current directions in response to the incoming driving signal in order to create the sawtooth waveform illustrated in graph C of FIG. 2. The low pass filter/averager circuit comprising the resistor 34 and the capacitor 36 keeps the gate voltages at the path 30 constant and equal to the average voltage appearing across the sawtooth capacitor 38. The filter capacitor 36 is made relatively large in capacitance in order to minimize coupling of the sawtooth waveform on the path 32 to the gates of the transistors 26 and 28. Because voltage changes linearly with time in both directions, it is necessarily the case that the V+ sawtooth waveform of graph C is greater than the reference voltage V− on the path 30 half of the time (once the reference voltage V− "locks" at the average value of the sawtooth V+); and, that the reverse is true for the other half of the time. The output waveform on the path 42 from the differential amplifier 40 is then a fifty percent duty cycle clock at twice the frequency of the incoming clock. Finally, the signal on the path 24 must switch between an invariant positive voltage and a solid ground return path. One satisfactory way to implement this requirement is to design the input driver-buffer 22 such that it that drives the CMOS pair 26 and 28 to approach the supply voltage limits ("rails").

It is further important to proper operation of the circuit 10 that the delay through the exclusive-OR gate 14 from low to high remain approximately unchanged between the delay occurring when the undelayed input switches from low to high while the delayed input remains low and the delay occurring when the undelayed input switches from high to low while the delayed input remains high. Since the circuit 10 requires an input clock of constant duty cycle, it is important the the gate delay through the exclusive-OR gate 14 from high to low remain approximately unchanged when the delayed input switches from high to low while the undelayed input remains low, and also when the input switches from low to high while the undelayed input remains high.

Figure 3:
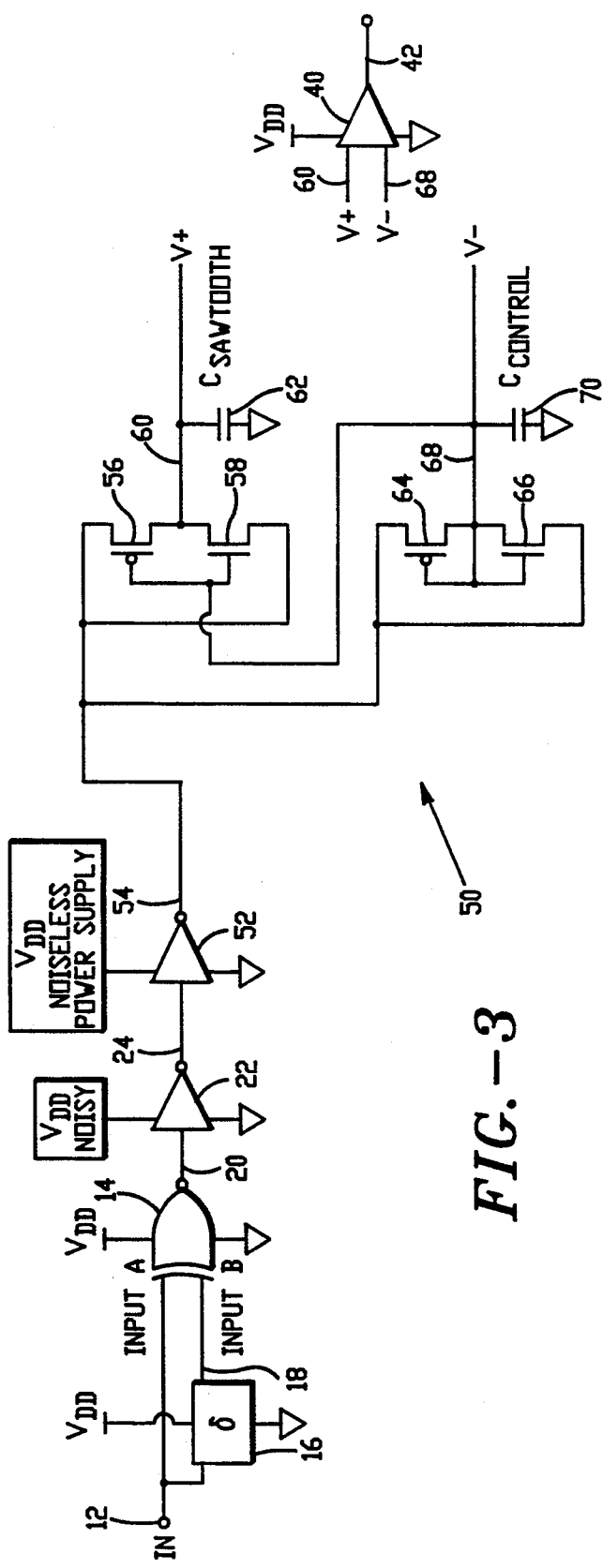
FIG. 3 is an alternative preferred embodiment of a circuit in accordance with principles and aspects of the present invention.

In some design situations, it may be impractical to make the resistance of the resistor 34 large enough so that the current passing through it is negligible compared to the current passing through the FET current sources 26 and 28. In this situation, FIG. 3 illustrates a circuit 50 in which the current source control voltage applied to the gates of the current source transistors is generated without a low pass filter. In FIG. 3, the same circuit elements and circuit points found in the FIG. 1 embodiment bear the same reference numerals, and the explanation previously given for them will not be repeated.

Noise on the input of the circuit 50 greatly affects the shape of the sawtooth waveform. The buffer 22 which drives the CMOS pair 26, 28 in the circuit 10 desirably has a noise free power supply. If necessary, the power supply connections to all duty cycle equalization circuit input buffers 22 can be joined, pinned out, and low pass filtered off-chip. Alternatively, as shown in the FIG. 3 circuit 50, the driver 22 is a noisy signal source and its output on the path 24 is passed through a buffer 52 supplied from a noiseless power supply which effectively removes the noise from the driving signal of graph B of FIG. 2.

The circuit 50 also includes a first CMOS pair 56,58 having a commonly connected source node 60. A sawtooth capacitor 62 is connected from the path 60 to ground and forms the sawtooth waveform, graph C of FIG. 2 in response to driving currents sourced alternately by the FETS 56, 58 in response to the graph B driving signal received e.g. from the buffer 52 on the path 54.

At the same time, the driving signal on the path 54 is applied to drive a second CMOS pair 64, 66 having a common drain node 68. A control capacitor 70 is connected across the path 68 to ground and forms a reference voltage against which the sawtooth waveform formed across the sawtooth capacitor 62 is compared by the differential comparator 40 in the manner previously explained. The reference voltage developed at the path 68 is a sawtooth shaped waveform having an amplitude which is relatively negligible with respect to the amplitude of the sawtooth waveform developed at the path 60, either because of very long channel transistor current sources 64, 66, and/or because of a very large value control capacitor 70.

Figure 4:
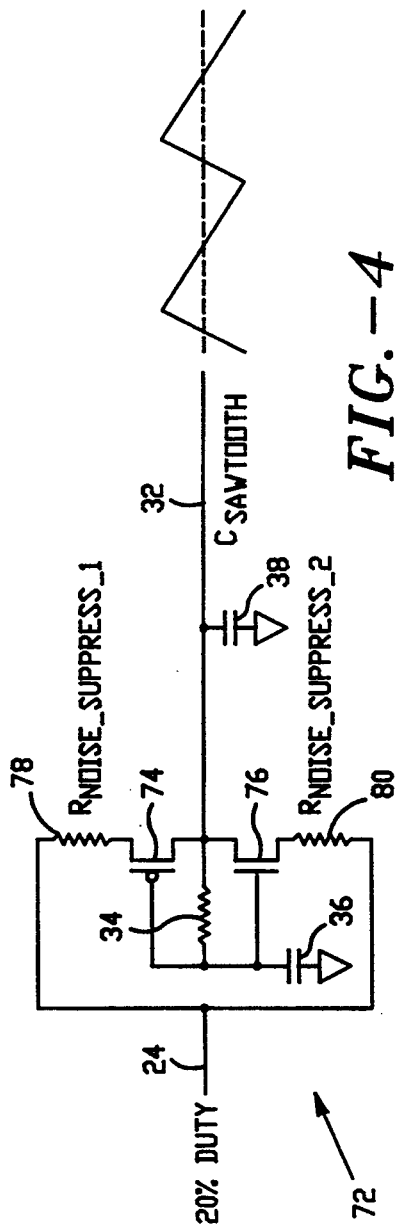
FIG. 4 is another preferred embodiment of a circuit in accordance with principles and aspects of the present invention.

As shown in FIG. 4, the effect of noise can be reduced by about 25% by providing a wave shaping circuit 72 in which the CMOS current sources 74, 76 have channel widths which are effectively doubled, and by inserting resistances 78, 80 respectively in series with the source nodes of the transistors 74, 76. However, the approach illustrated in FIG. 4 may consume more IC area than is required to form low pass filtering elements for filtering the buffer power supply 22.

Because the duty cycle equalization circuits 10, 50 and 72 rely upon the transistor current sources operating exclusively in the saturated operating region, the sawtooth capacitance 38, 62 must be made large enough to assure this condition. In order to accommodate process variations in forming integrated circuits including the circuits 10, 50 and/or 72, the nominal voltage swing on the sawtooth capacitance 38, 62 will have about half of the sum of the transistor threshold voltages. A nominal 500 millivolt voltage swing will produce a minimum and a maximum voltage swings of about 250 millivolts and 1000 millivolts, respectively, on the path 32 leading to the differential comparator 40. The transistor current sources 25, 28, (or 56, 58 in the circuit 50 of FIG. 3; or 74, 76 in the circuit 72 of FIG. 4) should remain in the saturated operating region up to 1000 millivolts peak to peak. A voltage level of 250 millivolts should be normally be adequate to obtain an acceptable equalized duty cycle output from the comparator 40.

Since the duty cycle equalization circuits illustrated herein require an input clock having a constant frequency, a two-times frequency multiplier may require an additional duty cycle equalization circuit to provide a constant duty cycle to the input of the digital two-times multiplier circuit, with three such circuits required for a four-times clock generator, four circuits for an eight-times clock generator circuit, etc.

Having thus described embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A duty cycle equalization circuit for equalizing the duty cycle of an incoming two-level logic driving signal, comprising:

an input for receiving the incoming two-level logic driving signal from a signal driving means, a first CMOS current source means having source electrodes connected to the input to receive the incoming two-level logic driving signal, having drain electrodes connected to a sawtooth signal forming path, and having gate electrodes connected to receive a reference voltage level from a reference voltage circuit means, sawtooth wave forming means connected to the sawtooth signal forming path for forming a sawtooth waveform, reference voltage circuit means for generating the reference voltage level at a substantially constant magnitude at a level between, and as a function of, the two-level logic driving signal, differential comparator means connected to receive the sawtooth waveform at a data input thereof, and to receive the reference voltage at a reference signal input thereof, and to put out a logical signal timed to correspond with crossings of the sawtooth signal through the reference voltage level.

2. The duty cycle equalization circuit set forth in claim 1 wherein the signal driving means comprises a first driver means connected to a clock source providing a clocking signal, for generating the two-level logic driving signal at the input.

3. The duty cycle equalization circuit set forth in claim 2 wherein the clock source includes an undelayed incoming clocking signal, a delay means connected to delay the incoming clocking signal by a predetermined amount to provide a delayed clocking signal, an exclusive-OR gate means connected to compare the incoming clocking and the delayed clocking signal to provide the clocking signal to the first driver means at twice the frequency of the incoming clocking signal.

4. The duty cycle equalization circuit set forth in claim 1 wherein the sawtooth wave forming means comprises a capacitor.

5. The duty cycle equalization circuit set forth in claim 1 wherein the reference voltage circuit means comprises a low pass filter having an input connected to the sawtooth signal forming path and having an output connected to gate electrodes of the first CMOS current source means, and wherein the function of the two-level logic driving signal forming the reference voltage level is an average of peak-to-peak amplitude of the sawtooth waveform.

6. The duty cycle equalization circuit set forth in claim 1 wherein the reference voltage circuit means comprises a second CMOS current source means having a common source electrode connection connected to receive the two-level logic driving signal at the input and having a common drain electrode output path to which a signal storage means is connected and to which gate electrodes of the second CMOS current source means are connected, the output path for providing the reference voltage level to the differential comparator means and to the gate electrodes of the first CMOS current source means.

7. The duty cycle equalization circuit set forth in claim 1 wherein the source electrodes of the CMOS current source means comprise a source electrode of a P-channel MOS transistor and a source electrode of an N-channel MOS transistor, and further comprising a noise reduction resistance means in series with each said source electrode and the input.

8. The duty cycle equalization circuit set forth in claim 2 wherein the signal driving means further comprises a second buffer-driver means connected to receive power supplied from a noiseless power supply means, the second driver-buffer means being connected between the first driver means and the input of the duty cycle equalization circuit.

9. A method for equalizing the duty cycle of an incoming two-level logic driving signal supplied by a driving means to an input, comprising the steps of:

receiving the incoming two-level logic driving signal at commonly connected source electrodes of a first CMOS current source means having source electrodes connected to the input to receive the incoming two-level logic driving signal and having drain electrodes connected to a sawtooth signal forming path, forming a sawtooth waveform at the sawtooth signal forming path via sawtooth wave forming means, generating a reference voltage level as a function of the two-level logic driving signal via reference voltage circuit means and providing the reference voltage level to commonly connected gate electrodes of the first CMOS current source, comparing the sawtooth waveform at the sawtooth signal forming path and the reference voltage level with differential comparator means and, putting out from an output of the differential comparator means an equalized duty cycle logical signal timed by crossings of the sawtooth signal through the reference voltage level.

10. The method for equalizing the duty cycle of an incoming two-level logic driving signal as set forth in claim 9 and comprising the further step of generating the incoming two-level logic driving signal by the steps of:

generating a clocking signal with a clock source means, delaying the clocking signal with a delay means to provide a delayed clocking signal, comparing the clocking signal and the delayed clocking signal in an exclusive-OR gate means having inputs connected to the clock source means and the delay means, and having an output providing the two-level logic driving signal at a frequency which is twice the frequency of the clocking signal.

11. The method for equalizing the duty cycle of an incoming two-level logic driving signal as set forth in claim 9 wherein the step of generating a reference voltage level comprises the step of low pass filtering the sawtooth waveform at the sawtooth signal forming path with a low pass filter means, and providing an output of the low pass filter means to control the potential at the commonly connected gate electrodes of the first CMOS current source.

* * * * *